(12) United States Patent
Kato et al.

(10) Patent No.: US 12,237,409 B2
(45) Date of Patent: Feb. 25, 2025

(54) SEMICONDUCTOR DEVICE

(71) Applicant: KABUSHIKI KAISHA TOSHIBA, Tokyo (JP)

(72) Inventors: Daimotsu Kato, Kawasaki (JP); Yosuke Kajiwara, Yokohama (JP); Hiroshi Ono, Setagaya (JP); Aya Shindome, Yokohama (JP); Akira Mukai, Kawasaki (JP); Po-Chin Huang, Bunkyo (JP); Masahiko Kuraguchi, Yokohama (JP); Tatsuo Shimizu, Shinagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 550 days.

(21) Appl. No.: 17/652,981

(22) Filed: Mar. 1, 2022

(65) Prior Publication Data

US 2023/0068711 A1 Mar. 2, 2023

(30) Foreign Application Priority Data

Aug. 27, 2021 (JP) ................................ 2021-139068
Jan. 4, 2022 (JP) ................................ 2022-000057

(51) Int. Cl.
*H01L 31/072* (2012.01)
*H01L 29/20* (2006.01)
(Continued)

(52) U.S. Cl.
CPC ...... *H01L 29/7786* (2013.01); *H01L 29/2003* (2013.01); *H01L 29/2006* (2013.01); *H01L 29/205* (2013.01)

(58) Field of Classification Search
CPC ............. H01L 29/7786; H01L 29/2003; H01L 29/2006; H01L 29/205; H01L 29/402; H01L 29/4236; H01L 29/51
(Continued)

(56) References Cited

U.S. PATENT DOCUMENTS 9,450,063 B2 9/2016 Prechtl
2007/0272969 A1* 11/2007 Teraguchi ........... H01L 29/7787
257/E29.253

(Continued)

FOREIGN PATENT DOCUMENTS

JP 2016-86108 A 5/2016
JP 2020-17577 A 1/2020
(Continued)

*Primary Examiner* — Theresa T Doan
(74) *Attorney, Agent, or Firm* — Oblon, McClelland, Maier & Neustadt, L.L.P.

(57) ABSTRACT

According to one embodiment, a semiconductor device includes first to third electrodes, a semiconductor member, a first conductive member, first and second insulating members, and a first nitride member. A position of the third electrode in a first direction from the first to second electrodes is between positions of the first and second electrodes in the first direction. The semiconductor member includes first and second semiconductor regions. The first semiconductor region includes first to fifth partial regions. The second semiconductor region includes first and second semiconductor portions. The second semiconductor portion includes first and second portions, and a third portion between the first and second portions. The first conductive member includes first and second conductive regions. The first insulating member includes a first insulating region. The second insulating member includes first and second insulating portions. The first nitride member includes a first nitride region.

20 Claims, 3 Drawing Sheets

(51) Int. Cl.
*H01L 29/205* (2006.01)
*H01L 29/778* (2006.01)
*H01L 31/109* (2006.01)

(58) Field of Classification Search
USPC .......................................................... 257/194
See application file for complete search history.

(56) References Cited

U.S. PATENT DOCUMENTS

| | | | |
|---|---|---|---|
| 2010/0276732 A1* | 11/2010 | Ando | ................. H01L 29/0891 257/192 |
| 2017/0345919 A1 | 11/2017 | Oyama et al. | |
| 2020/0027976 A1 | 1/2020 | Mukai et al. | |
| 2020/0295169 A1 | 9/2020 | Kato et al. | |
| 2021/0384337 A1 | 12/2021 | Kato et al. | |

FOREIGN PATENT DOCUMENTS

| | | |
|---|---|---|
| JP | 2020-150141 A | 9/2020 |
| WO | WO 2016/103603 A1 | 6/2016 |

\* cited by examiner

FIG. 6

SEMICONDUCTOR DEVICE

CROSS-REFERENCE TO RELATED APPLICATIONS

This application is based upon and claims the benefit of priority from Japanese Patent Application No. 2021-139068, filed on Aug. 27, 2021, and Japanese Patent Application No. 2022-000057, filed on Jan. 4, 2022; the entire contents of which are incorporated herein by reference.

FIELD

Embodiments described herein generally relate to a semiconductor device.

BACKGROUND

For example, there is a semiconductor device using a nitride semiconductor. Improvement of characteristics is desired in semiconductor devices.

DETAILED DESCRIPTION

According to one embodiment, a semiconductor device includes a first electrode, a second electrode, a third electrode, a semiconductor member, a first conductive member, a first insulating member, a second insulating member, and a first nitride member. A position of the third electrode in a first direction from the first electrode to the second electrode is between a position of the first electrode in the first direction and a position of the second electrode in the first direction. The semiconductor member includes a first semiconductor region and a second semiconductor region. The first semiconductor region includes $Al_{x1}Ga_{1-x1}N$ ($0 \le x1 < 1$). The first semiconductor region includes a first partial region, a second partial region, a third partial region, a fourth partial region, and a fifth partial region. A second direction from the first partial region to the first electrode crosses the first direction. A direction from the second partial region to the second electrode is along the second direction. A direction from the third region to the third electrode is along the second direction. A position of the fourth partial region in the first direction is between a position of the first partial region in the first direction and a position of the third partial region in the first direction. A position of the fifth partial region in the first direction is between the position of the third partial region in the first direction and a position of the second partial region in the first direction. The second semiconductor region includes $Al_{x2}Ga_{1-x2}N$ ($0 \le x2 \le 1$, $x1<x2$). The second semiconductor region includes a first semiconductor portion and a second semiconductor portion. A direction from the fourth partial region to the first semiconductor portion is along the second direction. A direction from the fifth partial region to the second semiconductor portion is along the second direction. The second semiconductor portion includes a first portion, a second portion, and a third portion between the first portion and the second portion. A position of the second portion in the first direction is between a position of the first portion in the first direction and the position of the second electrode in the first direction. The first conductive member includes a first conductive region and a second conductive region. The first conductive region overlaps the third electrode in the second direction. The first portion is between the fifth partial region and a part of the first conductive region. The first conductive member is electrically connected with one of the first electrode and the third electrode, or the first conductive member is configured to be electrically connected with the one of the first electrode and the third electrode. The first insulating member includes a first insulating region. The first insulating region is between the third partial region and the third electrode in the second direction. The second insulating member includes a first insulating portion and a second insulating portion. The first insulating portion is between the first portion and the first conductive region in the second direction. The second portion is between the fifth partial region and the second insulating portion. The first nitride member includes $Al_{x3}Ga_{1-x3}N$ ($0 \le x3 < 1$) or $In_{y1}Al_{y2}Ga_{1-y1-y2}N$ ($0<y1 \le 1$, $0 \le y2 \le 1$, $y1+y2 \le 1$). The first nitride member includes a first nitride region. The first nitride region is between the first insulating portion and the second insulating portion in the first direction. The first nitride region is between the third portion and the second conductive region in the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
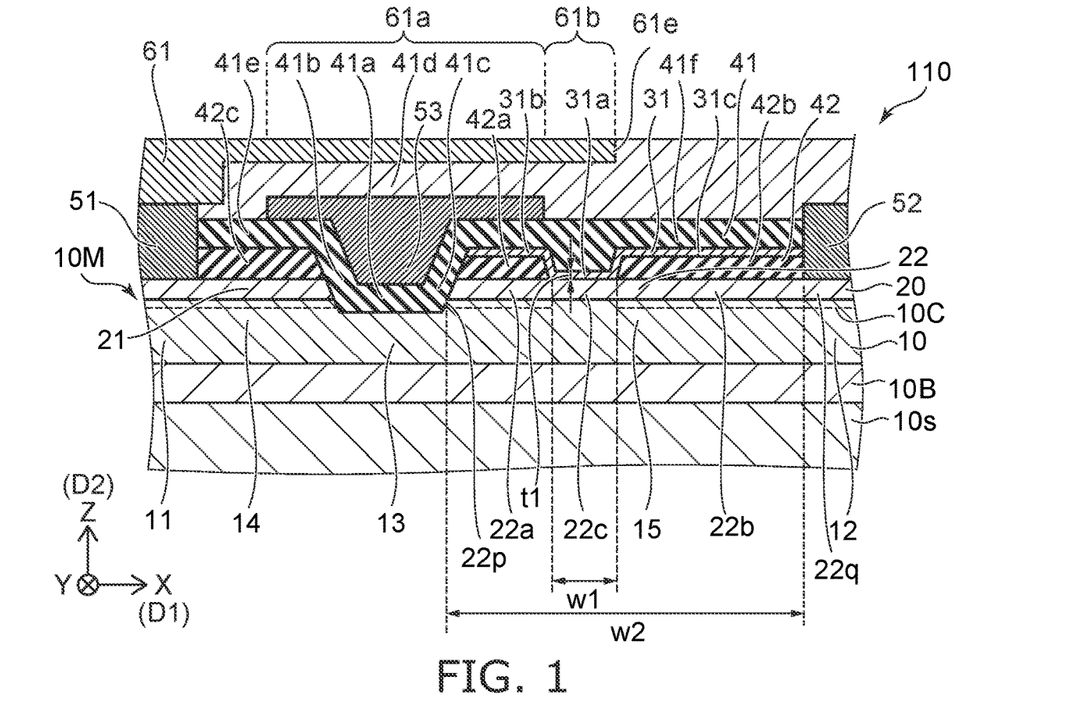
FIG. 1 is a schematic cross-sectional view illustrating a semiconductor device according to a first embodiment.

FIG. 1 is a schematic cross-sectional view illustrating a semiconductor device according to a first embodiment.

As shown in FIG. 1, a semiconductor device 110 according to the embodiment includes a first electrode 51, a second electrode 52, a third electrode 53, a semiconductor member 10M, a first conductive member 61, a first insulating member 41, and a second insulating member 42.

A direction from the first electrode 51 to the second electrode 52 is a first direction D1. The first direction D1 is defined as an X-axis direction. One direction perpendicular to the X-axis direction is defined as a Z-axis direction. The direction perpendicular to the X-axis direction and the Z-axis direction is defined as a Y-axis direction.

A position of the third electrode 53 in the first direction D1 is between a position of the first electrode 51 in the first direction D1 and a position of the second electrode 52 in the first direction D1. For example, at least a part of the third electrode 53 is located between the first electrode 51 and the second electrode 52 in the first direction D1.

The semiconductor member 10M includes a first semiconductor region 10 and a second semiconductor region 20. In this example, the semiconductor device 110 includes a base body 10s and a nitride semiconductor layer 10B. The nitride semiconductor layer 10B is provided between the base body 10s and the semiconductor member 10M. For example, the nitride semiconductor layer 10B is provided on the base body 10s. The semiconductor member 10M is provided on the nitride semiconductor layer 10B. For example, the first semiconductor region 10 is provided on the nitride semiconductor layer 10B. The second semiconductor region 20 is provided on the first semiconductor region 10. The first to third electrodes 51 to 53 are provided on the semiconductor member 10M. The base body 10s may be, for example, a silicon substrate or a SiC substrate. The nitride semiconductor layer 10B includes, for example, AlGaN.

The first semiconductor region 10 includes $Al_{x1}Ga_{1-x1}N$ ($0 \leq x1 < 1$). The first semiconductor region 10 is, for example, a GaN layer. The composition ratio x1 of Al in the first semiconductor region 10 may be, for example, not less than 0 and not more than 0.1.

For example, the first semiconductor region 10 includes GaN. The first semiconductor region 10 includes a first partial region 11, a second partial region 12, a third partial region 13, a fourth partial region 14, and a fifth partial region 15. The second direction D2 from the first partial region 11 to the first electrode 51 crosses the first direction D1. The second direction D2 may be, for example, the Z-axis direction.

A direction from the second partial region 12 to the second electrode 52 is along the second direction D2. A direction from the third partial region 13 to the third electrode 53 is along the second direction D2.

A portion of the first semiconductor region 10 that overlaps the first electrode 51 in the second direction D2 corresponds to the first partial region 11. A portion of the first semiconductor region 10 that overlaps the second electrode 52 in the second direction D2 corresponds to the second portion region 12. A portion of the first semiconductor region 10 that overlaps the third electrode 53 in the second direction D2 corresponds to the third portion region 13.

A position of the fourth partial region 14 in the first direction D1 is between a position of the first partial region 11 in the first direction D1 and a position of the third partial region 13 in the first direction D1. A position of the fifth partial region 15 in the first direction D1 is between a position of the third partial region 13 in the first direction D1 and a position of the second partial region 12 in the first direction D1. The first to fifth subregions 11 to 15 may be continuous with each other. The boundaries between the first to fifth subregions 11 to 15 may be clear or unclear.

The second semiconductor region 20 includes $Al_{x2}Ga_{1-x2}N$ ($0 < x2 \leq 1$, $x1 < x2$). The second semiconductor region 20 is, for example, an AlGaN layer. The composition ratio x2 of Al in the second semiconductor region 20 may be, for example, not less than 0.25 and not more than 0.4.

The second semiconductor region 20 includes a first semiconductor portion 21 and the second semiconductor portion 22. A direction from the fourth partial region 14 to the first semiconductor portion 21 is along the second direction D2. A direction from the fifth partial region 15 to the second semiconductor portion 22 is along the second direction D2. The second semiconductor portion 22 includes a first portion 22a, a second portion 22b, and a third portion 22c. The third portion 22c is between the first portion 22a and the second portion 22b. A position of the second portion 22b in the first direction D1 is between a position of the first portion 22a in the first direction D1 and the position of the second electrode 52 in the first direction D1. The first to third portions 22a to 22c may be continuous with each other. The boundary between the first to third portions 22a to 22c may be clear or unclear.

For example, the first electrode 51 is electrically connected with the first semiconductor portion 21. For example, the second electrode 52 is electrically connected with the second semiconductor portion 22.

The first conductive member 61 includes a first conductive region 61a and a second conductive region 61b. The first conductive region 61a overlaps the third electrode 53 in the second direction D2. The second conductive region 61b does not overlap the third electrode 53 in the second direction D2. A position of the second conductive region 61b in the first direction D1 is between the position of the third electrode 53 in the first direction D1 and the position of the second electrode 52 in the first direction D1. The second conductive region 61b corresponds to a protruding portion protruding toward a side of the second electrode 52 with reference to the third electrode 53. The second conductive region 61b corresponds to, for example, the eaves.

The first portion 22a is located between the fifth partial region 15 and a part of the first conductive region 61a in the second direction D2. In this example, the third electrode 53 is located between the fifth partial region 15 and the first conductive region 61a in the second direction D2. At least a part of the second portion 22b does not overlap the first conductive member 61 in the second direction D2.

In the embodiment, the first conductive member 61 is electrically connected with one of the first electrode 51 and the third electrode 53. Alternatively, the first conductive member 61 is configured to be electrically connect with one of the first electrode 51 and the third electrode 53. In the first embodiment, the first conductive member 61 is electrically connected with the first electrode 51. A terminal electrically connected with the first conductive member 61 and a terminals electrically connected with the first electrode 51 may be provided, and these terminals may be electrically connected when the semiconductor device is used.

For example, the first conductive member 61 includes a first conductive end portion 61e. The first conductive end portion 61e is an end on the side of the second electrode 52 in the first direction D1. A position of the first conductive end portion 61e in the first direction D1 is between the position of the third electrode 53 in the first direction D1 and the position of the second electrode 52 in the first direction D1.

The first insulating member 41 includes a first insulating region 41a. The first insulating region 41a is located between the third partial region 13 and the third electrode 53 in the second direction D2.

The second insulating member 42 includes a first insulating portion 42a and a second insulating portion 42b. The first insulating portion 42a is located between the first portion 22a and the first conductive region 61a in the second direction D2. The second portion 22b is between the fifth portion region 15 and the second insulating portion 42b.

The first nitride member 31 includes $Al_{x3}Ga_{1-x3}N$ ($0 \leq x3 < 1$). The first nitride member 31 is, for example, a GaN layer or an AlGaN layer. The composition ratio x3 of Al in the first nitride member 31 may be, for example, not less than 0 and not more than 0.5. For example, the composition ratio x3 of Al in the first nitride member 31 is lower than the composition ratio x2 of Al in the second semiconductor region 20 (for example, the second semiconductor portion 22).

The first nitride member 31 includes a first nitride region 31a. The first nitride region 31a is located between the first insulating portion 42a and the second insulating portion 42b in the first direction D1. The first nitride region 31a is between the third portion 22c and the second conductive region 61b in the second direction D2. The first nitride region 31a overlaps the second conductive region 61b in the second direction D2.

A current flowing between the first electrode 51 and the second electrode 52 can be controlled by a potential of the third electrode 53. The potential of the third electrode 53 may be, for example, a potential based on a potential of the first electrode 51. For example, the first electrode 51 functions as a source electrode. The second electrode 52 functions as a drain electrode. The third electrode 53 functions as a gate electrode. The first insulating region 41a functions as a gate insulating film. The semiconductor device 110 is, for example, a transistor. For example, a distance between the first electrode 51 and the third electrode 53 is shorter than a distance between the third electrode 53 and the second electrode 52.

A carrier region 10C is formed in a portion of the first semiconductor region 10 facing the second semiconductor region 20. The carrier region 10C is, for example, a two-dimensional electron gas. The semiconductor device 110 is, for example, a HEMT (high electron mobility transistor).

The first conductive member 61 functions as, for example, a field plate. As described above, in the embodiment, the first conductive member 61 is provided with the second conductive region 61b (protruding portion or eaves portion). The first nitride region 31a (GaN or AlGaN) is provided at a position overlapping the second conductive region 61b. As a result, the carrier concentration in the carrier region 10C locally decreases in the region overlapping the second conductive region 61b.

Generally, the electric field is concentrated at the end (first conductive end 61e) of the second conductive region 61b (protruding portion or eaves). The breakdown voltage tends to decrease due to the concentration of the electric field. In the embodiment, the carrier concentration can be locally reduced in the region overlapping the second conductive region 61b. As a result, high breakdown voltage can be easily obtained. According to the embodiment, it is possible to provide a semiconductor device whose characteristics can be improved.

In this example, the first nitride member 31 includes a second nitride region 31b and a third nitride region 31c. The first insulating portion 42a is between the first portion 22a and the second nitride region 31b. The second insulating portion 42b is between the second portion 22b and the third nitride region 31c. The first nitride region 31a, the second nitride region 31b, and the third nitride region 31c may be continuous with each other. The boundaries between the first nitride region 31a, the second nitride region 31b, and the third nitride region 31c may be clear or unclear. By continuously providing the first nitride region 31a, the second nitride region 31b, and the third nitride region 31c, the formation of the first nitride member 31 is easy.

A portion of the first nitride member 31 that overlaps the second conductive region 61b in the second direction D2 corresponds to the first nitride region 31a. In the first nitride member 31, a portion between the first insulating portion 42a and the second insulating portion 42b in the first direction D1 corresponds to the first nitride region 31a. In this example, the first nitride region 31a is in contact with the third portion 22c. As will be described later, another layer (for example, an AlN layer) may be provided between the first nitride region 31a and the third portion 22c.

For example, the crystallinity of the first nitride region 31a may be higher than the crystallinity of the second nitride region 31b and may be higher than the crystallinity of the third nitride region 31c. At least a part of the first nitride region 31a may include crystals. At least a part of the second nitride region 31b may be amorphous. At least a part of the third nitride region 31c may be amorphous.

The thickness t1 of the first nitride region 31a along the second direction D2 is, for example, not less than 1 nm and not more than 10 nm. When the thickness t1 is not less than 1 nm, for example, a homogeneous first nitride region 31a can be easily obtained. When the thickness t1 is not more than 10 nm, it is easy to suppress crystal defects such as misfit dislocations caused by film stress, for example. The thickness t1 may be not less than 3 nm and not more than 5 nm. When the thickness t1 is not less than 3 nm, for example, a homogeneous first nitride region 31a can be more easily obtained. When the thickness t1 is not less than 3 nm, for example, the carrier concentration can be stably controlled. When the thickness t1 is not more than 5 nm, it is easier to suppress crystal defects such as misfit dislocations caused by film stress, for example.

In the embodiment, the second insulating member 42 includes silicon and nitrogen. The second insulating member 42 includes, for example, SiN. With such a second insulating member 42, high quality can be easily obtained in the semiconductor member 10M under the second insulating member 42.

For example, the first insulating member 41 includes silicon and oxygen. The first insulating member 41 includes, for example, silicon oxide ($SiO_2$). For example, the first insulating member 41 does not nitrogen substantially. Alternatively, the concentration of nitrogen in the first insulating member 41 is lower than the concentration of nitrogen in the second insulating member 42. With such a first insulating member 41, for example, a stable threshold voltage can be easily obtained.

As shown in FIG. 1, the first insulating member 41 may further include a second insulating region 41b and a third insulating region 41c. The second insulating region 41b is located between the first semiconductor portion 21 and the third electrode 53 in the first direction D1. The third insulating region 41c is located between the third electrode 53 and the second semiconductor portion 22 in the first direction D1. At least a part of the third electrode 53 is between the first semiconductor portion 21 and the second semiconductor portion 22 in the first direction D1.

At least a part of the first insulation region 41a is between the fourth partial region 14 and the fifth partial region 15 in the first direction D1. For example, the semiconductor member 10M is provided with a recess, and at least a part of the third electrode 53 is filled in the recess. The semiconductor device 110 is a gate recess type transistor.

As shown in FIG. 1, the second insulating member 42 may include a third insulating portion 42c. The first semiconductor portion 21 is between the fourth portion region 14 and the third insulating portion 42c.

As shown in FIG. 1, the first insulating member 41 further includes a fourth insulating region 41d. At least a part of the fourth insulating region 41d is between the third electrode 53 and the first conductive member 61.

The first insulating member 41 may include a fifth insulating region 41e and a sixth insulating region 41f. The first semiconductor portion 21 is between the fourth partial region 14 and the fifth insulating region 41e. The second semiconductor portion 22 is between the fifth portion region 15 and the sixth insulating region 41f.

As shown in FIG. 1, a length of the first nitride region 31a along the first direction D1 is defined as a first length w1. The second semiconductor portion 22 includes an end 22p on the side of the third electrode 53. The second semiconductor portion 22 includes a portion 22q that overlaps the second electrode 52 in the second direction D2. A distance in the first direction D1 between the end 22p on the side of the third electrode 53 of the second semiconductor portion 22 and the position of the portion 22q of the second semiconductor portion 22 that overlaps the second electrode 52 in the second direction D2 is defined as a second length w2. The first length w1 is, for example, note less than 0.035 times and not more than 0.5 times the second length w2. With such a first length w1, for example, a region in which the carrier concentration is controlled is appropriately formed, and a high breakdown voltage can be effectively obtained.

Figure 2:
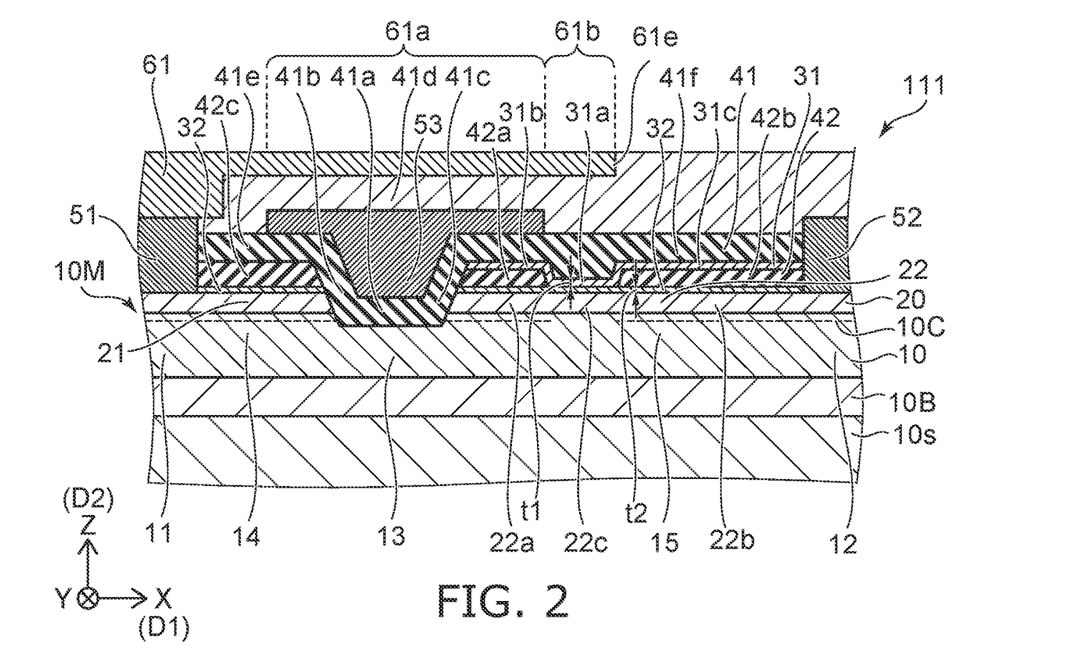
FIG. 2 is a schematic cross-sectional view illustrating a semiconductor device according to the first embodiment.

FIG. 2 is a schematic cross-sectional view illustrating a semiconductor device according to the first embodiment.

As shown in FIG. 2, a semiconductor device 111 according to the embodiment includes a second nitride member 32. Except for this, the configuration of the semiconductor device 111 is the same as the configuration of the semiconductor device 110. For example, in the semiconductor device 111, the configurations of the first electrode 51, the second electrode 52, the third electrode 53, the semiconductor member 10M, the first conductive member 61, the first insulating member 41, the second insulating member 42, and the first nitride member 31 may be the same as those in the semiconductor device 110.

The second nitride member 32 includes $Al_{x4}Ga_{1-x4}N$ (0<x4≤1, x3<x4). The second nitride member 32 may be, for example, an AlN layer. The composition ratio x4 of Al in the second nitride member 32 may be, for example, not less than 0.5 and not more than 1.0.

At least a part of the second nitride member 32 is between the first portion 22a and the first insulating portion 42a, and between the second portion 22b and the second insulating portion 42b. A part of the second nitride member 32 may be provided between the third portion 22c and the first nitride region 31a.

By providing the second nitride member 32 as described above, high quality can be obtained in the second semiconductor portion 22. For example, damage to the second semiconductor portion 22 by the second insulating member 42 can be suppressed.

Also in the semiconductor device 111, the carrier concentration can be locally reduced in the region overlapping the second conductive region 61b. High breakdown voltage is easy to obtain. It is possible to provide a semiconductor device whose characteristics can be improved.

For example, the second nitride member 32 may be in contact with the third portion 22c and the first nitride region 31a.

As shown in FIG. 2, a part of the second nitride member 32 may be provided between the first semiconductor portion 21 and the third insulating portion 42c. For example, damage to the second semiconductor portion 22 by the second insulating member 42 can be suppressed.

The thickness t2 of the second nitride member 32 along the second direction D2 is, for example, not less than 1 nm and not more than 10 nm. When the thickness t2 is not less than 1 nm, for example, damage to the second semiconductor region 20 can be effectively suppressed. When the thickness t2 is not more than 10 nm, for example, in the second nitride member 32, it is easy to suppress crystal defects such as misfit dislocations due to film stress. The thickness t2 may be, for example, not less than 3 nm and not more than 5 nm. When the thickness t2 is not less than 3 nm, damage to the second semiconductor region 20 can be suppressed more effectively. When the thickness t2 is not more than 5 nm, it is easier to suppress crystal defects such as misfit dislocations due to film stress.

Second Embodiment

Figure 3:
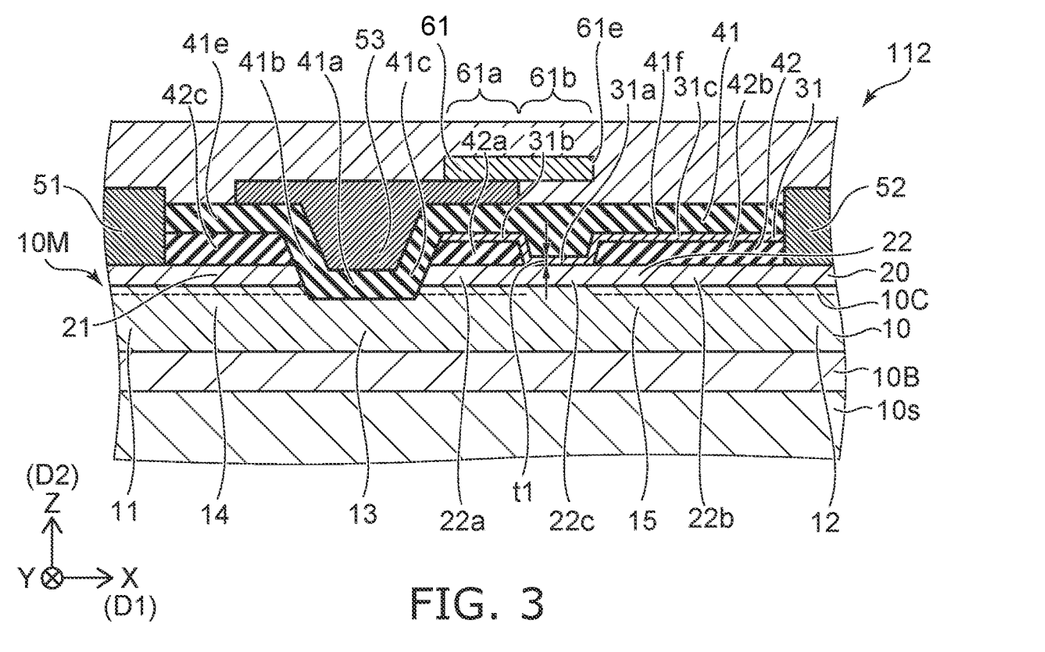
FIG. 3 is a schematic cross-sectional view illustrating a semiconductor device according to a second embodiment.

FIG. 3 is a schematic cross-sectional view illustrating a semiconductor device according to a second embodiment.

As shown in FIG. 3, in a semiconductor device 112 according to the embodiment, the first conductive member 61 is electrically connected with the third electrode 53. Except for this, the configuration of the semiconductor device 112 is the same as the configuration of the semiconductor device 110. For example, in the semiconductor device 112, the configuration of the first electrode 51, the second electrode 52, the third electrode 53, the semiconductor member 10M, the first insulating member 41, the second insulating member 42, and the first nitride member 31 may be the same as those in the semiconductor device 110.

In the semiconductor device 112, a terminal electrically connected with the first conductive member 61 and a terminal electrically connected with the third electrode 53 are provided, and these terminals may be electrically connected when the semiconductor device is used.

The first nitride region 31a is also provided in the semiconductor device 112. The first nitride region 31a is located between the first insulating portion 42a and the second insulating portion 42b in the first direction D1. The first nitride region 31a is between the third portion 22c and the second conductive region 61b in the second direction D2. The first nitride region 31a overlaps the second conductive region 61b in the second direction D2.

As a result, the carrier concentration in the carrier region 10C locally decreases in the region overlapping the second conductive region 61b. As a result, high breakdown voltage can be easily obtained. According to the embodiment, it is possible to provide a semiconductor device whose characteristics can be improved.

Figure 4:
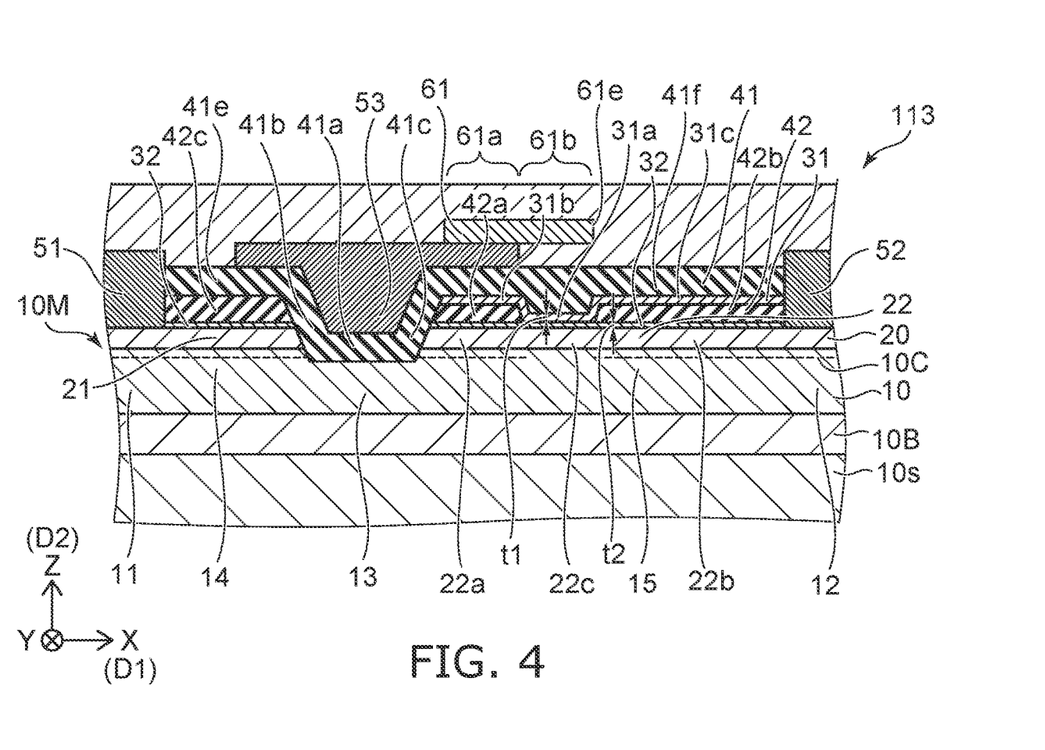
FIG. 4 is a schematic cross-sectional view illustrating a semiconductor device according to the second embodiment.

FIG. 4 is a schematic cross-sectional view illustrating a semiconductor device according to the second embodiment.

As shown in FIG. 4, a semiconductor device 113 according to the embodiment includes the second nitride member 32. Except for this, the configuration of the semiconductor device 113 is the same as the configuration of the semiconductor device 112. For example, in the semiconductor device 113, the configurations of the first electrode 51, the second electrode 52, the third electrode 53, the semiconductor member 10M, the first conductive member 61, the first insulating member 41, the second insulating member 42, and the first nitride member 31 may be the same as those in the semiconductor device 112.

Also in the semiconductor device 113, the carrier concentration can be locally lowered in the region overlapping the second conductive region 61b. High breakdown voltage is easy to obtain. It is possible to provide a semiconductor device whose characteristics can be improved.

In the embodiment, information on crystallinity can be obtained, for example, by an X-ray diffraction pattern image. Information on the composition ratio can be obtained by, for example, X-ray photoelectron spectroscopy.

Un the semiconductor devices 110 to 113 according to the embodiment, the first nitride member 31 may include In, Ga and nitrogen. For example, the first nitride member 31 may include $Al_{x3}Ga_{1-x3}N$ ($0 \leq x3 < 1$) or $In_{y1}Al_{y2}Ga_{1-y1-y2}N$ ($0 < y1 \leq 1$, $0 \leq y2 < 1$, $y1+y2 \leq 1$). For example, the first nitride member 31 may include $In_{y1}Ga_{1-y1}N$ ($0 < y1 \leq 1$). On the other hand, the second nitride member 32 includes $Al_{x4}Ga_{1-x4}N$ ($0 < x4 \leq 1$, $x3 < x4$). For example, the first nitride member 31 includes InGaN, and the second nitride member 32 includes AlGaN or AlN.

Third Embodiment

Figure 5:
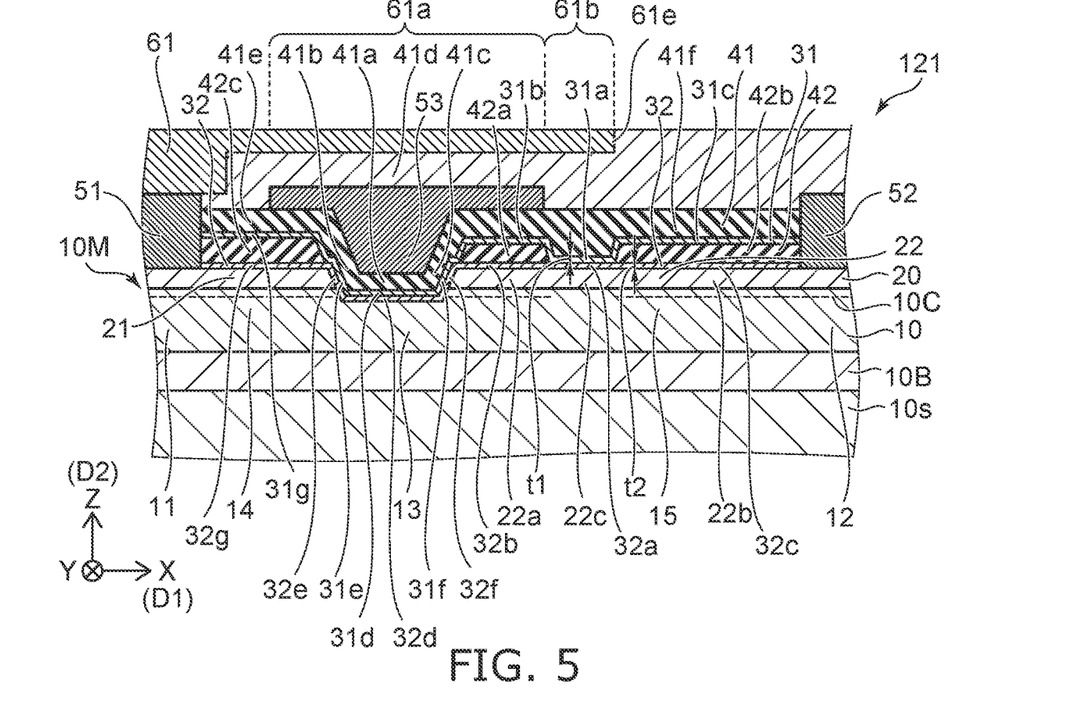
FIG. 5 is a schematic cross-sectional view illustrating a semiconductor device according to a third embodiment.

FIG. 5 is a schematic cross-sectional view illustrating a semiconductor device according to a third embodiment.

As shown in FIG. 5, in a semiconductor device 121, the first nitride member 31 includes fourth to seventh nitride regions 31d to 31g in addition to the first to third nitride regions 31a to 31c. The second nitride member 32 includes first to seventh nitride portions 32a to 32g.

The first nitride portion 32a is between the third portion 22c and the first nitride region 31a. The second nitride portion 32b is between the first portion 22a and the second nitride region 31b. The third nitride portion 32c is between the second portion 22b and the third nitride region 31c.

The fourth nitride region 31d is located between the third partial region 13 and the third electrode 53 in the second direction D2. The fifth nitride region 31e is, for example, between the first semiconductor portion 21 and at least a part of the third electrode 53 in the first direction D1. The fifth nitride region 31e is, for example, between the first semiconductor portion 21 and at least a part of the second insulating region 41b in the first direction D1. The sixth nitride region 31f is, for example, between at least a part of the third electrode 53 and the first portion 22a in the first direction D1. The sixth nitride region 31f is, for example, between at least a part of the third insulating region 41c and the first portion 22a in the first direction D1.

The fourth nitride portion 32d is located between the third partial region 13 and the fourth nitride region 31d in the second direction D2. The fifth nitride portion 32e is located between the first semiconductor portion 21 and the fifth nitride region 31e in the second direction D2. The sixth nitride portion 32f is located between the sixth nitride region 31f and the first portion 22a in the second direction D2.

The first semiconductor portion 21 is located between the fourth partial region 14 and the seventh nitride region 31g in the second direction D2. The third insulating portion 42c is located between the seventh nitride portion 32g and the seventh nitride region 31g in the second direction D2.

The configuration of the semiconductor device 121 other than the above may be the same as that of the semiconductor device 111. By providing the first nitride member 31 and the second nitride member 32 as described above, for example, a lower subthreshold swing can be easily obtained.

Figure 6:
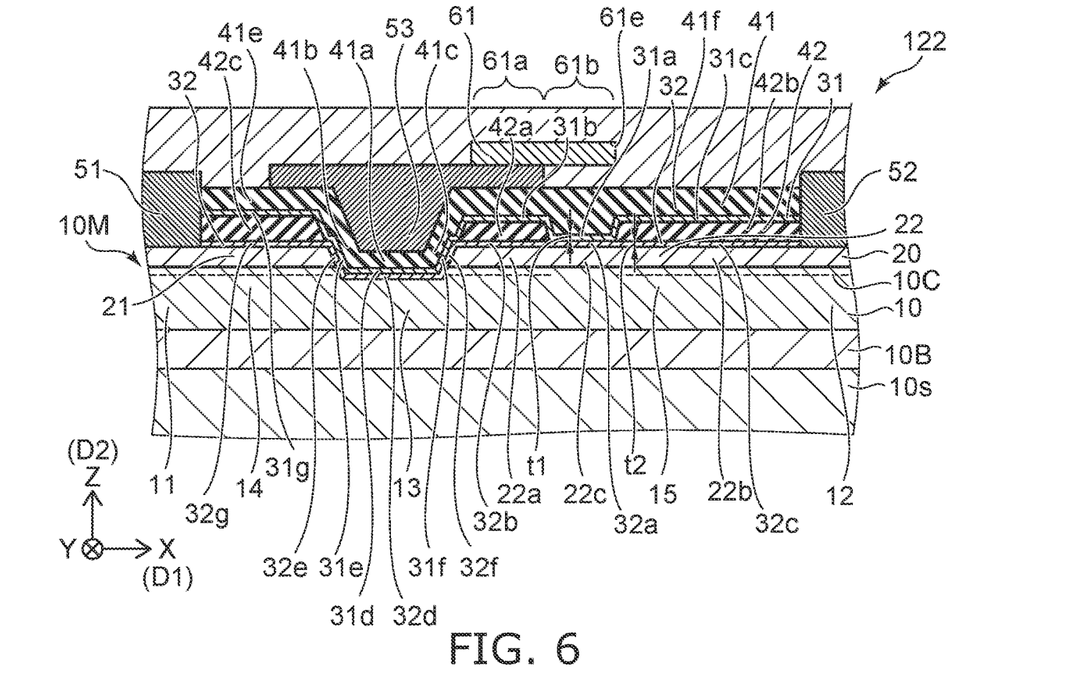
FIG. 6 is a schematic cross-sectional view illustrating a semiconductor device according to the third embodiment.

FIG. 6 is a schematic cross-sectional view illustrating a semiconductor device according to the third embodiment.

As shown in FIG. 6, in a semiconductor device 122, the first nitride member 31 includes the first to seventh nitride regions 31a to 31g. The second nitride member 32 includes the first to seventh nitride portions 32a to 32g. The configuration of the semiconductor device 122 other than the above may be the same as that of the semiconductor device 112. By providing the first nitride member 31 and the second nitride member 32 as described above, for example, a lower subthreshold swing can be easily obtained.

In the semiconductor devices 112 and 122, for example, the first nitride member 31 may include $Al_{x3}Ga_{1-x3}N$ ($0 \leq x3 < 1$) or $In_{y1}Al_{y2}Ga_{1-y1-y2}N$ ($0 < y1 \leq 1$, $0 \leq y2 \leq 1$, $y1+y2 \leq 1$). For example, the first nitride member 31 may include $In_{y1}Ga_{1-y1}N$ ($0 < y1 \leq 1$). On the other hand, the second nitride member 32 includes $Al_{x4}Ga_{1-x4}N$ ($0 < x4 \leq 1$, $x3 < x4$). For example, the first nitride member 31 includes InGaN, and the second nitride member 32 includes AlGaN or AlN.

According to the embodiments, it is possible to provide a semiconductor device whose characteristics can be improved.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes semiconductor members, compound members, nitride members, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode;

a third electrode, a position of the third electrode in a first direction from the first electrode to the second electrode being between a position of the first electrode in the first direction and a position of the second electrode in the first direction;

a semiconductor member including a first semiconductor region and a second semiconductor region, the first semiconductor region including $Al_{x1}Ga_{1-x1}N$ ($0 \leq x1 < 1$), the first semiconductor region including a first partial region, a second partial region, a third partial region, a fourth partial region, and a fifth partial region, a second direction from the first partial region to the first electrode crossing the first direction, a direction from the second partial region to the second electrode being along the second direction, a direction from the third region to the third electrode being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;

the second semiconductor region including $Al_{x2}Ga_{1-x2}N$ ($0 < x2 \leq 1$, $x1 < x2$), the second semiconductor region including a first semiconductor portion and a second semiconductor portion, a direction from the fourth partial region to the first semiconductor portion being along the second direction, a direction from the fifth partial region to the second semiconductor portion being along the second direction, the second semiconductor portion including a first portion, a second portion, and a third portion between the first portion and the second portion, a position of the second portion in the first direction being between a position of the first portion in the first direction and the position of the second electrode in the first direction;

a first conductive member including a first conductive region and a second conductive region, the first conductive region overlapping the third electrode in the second direction, the first portion being between the fifth partial region and a part of the first conductive region, the first conductive member being electrically connected with one of the first electrode and the third electrode, or the first conductive member being configured to be electrically connected with the one of the first electrode and the third electrode;

a first insulating member including a first insulating region, the first insulating region being between the third partial region and the third electrode in the second direction;

a second insulating member including a first insulating portion and a second insulating portion, the first insulating portion being between the first portion and the first conductive region in the second direction, the second portion being between the fifth partial region and the second insulating portion; and a first nitride member including $Al_{x3}Ga_{1-x3}N$ ($0 \leq x3 < 1$) or $In_{y1}Al_{y2}Ga_{1-y1-y2}N$ ($0 < y1 \leq 0 \leq y2 \leq 1$, $y1+y2 \leq 1$), the first nitride member including a first nitride region, the first nitride region being between the first insulating portion and the second insulating portion in the first direction, the first nitride region being between the third portion and the second conductive region in the second direction.

2. The device according to claim 1, wherein at least a part of the second insulating portion does not overlap the first conductive member in the second direction.

3. The device according to claim 1, wherein
the first nitride member further includes a second nitride region and a third nitride region,
the first insulating portion is between the first portion and the second nitride region, and
the second insulating portion is between the second portion and the third nitride region.

4. The device according to claim 3, wherein a crystallinity of the first nitride region is higher than a crystallinity of the second nitride region and higher than a crystallinity of the third nitride region.

5. The device according to claim 3, wherein
at least a part of the first nitride region includes a crystal,
at least a part of the second nitride region is amorphous, and
at least a part of the third nitride region is amorphous.

6. The device according to claim 1, wherein the first nitride region is in contact with the third portion.

7. The device according to claim 1, further comprising a second nitride member including $Al_{x4}Ga_{1-x4}N$ ($0 < x4 \leq 1$, $x3 < x4$),
at least a part of the second nitride member being between the first portion and the first insulating portion, and between the second portion and the second insulating portion.

8. The device according to claim 7, wherein a part of the second nitride member is between the third portion and the first nitride region.

9. The device according to claim 7, wherein the second nitride member is in contact with the third portion and the first nitride region.

10. The device according to claim 7, wherein a thickness of the second nitride member along the second direction is not less than 1 nm and not more than 10 nm.

11. The device according to claim 1, wherein the x3 is lower than the x2.

12. The device according to claim 1, wherein a thickness of the first nitride region along the second direction is not less than 1 nm and not more than 10 nm.

13. The device according to claim 1, wherein the second insulating member includes silicon and nitrogen.

14. The device according to claim 13, wherein
the first insulating member includes silicon and oxygen,
the first insulating member does not include nitrogen or a concentration of nitrogen in the first insulating member is lower than a concentration of nitrogen in the second insulating member.

15. The device according to claim 1, wherein
the first insulating member further includes a second insulating region and a third insulating region,
the second insulating region is between the first semiconductor portion and the third electrode in the first direction, and
the third insulating region is between the third electrode and the second semiconductor portion in the first direction.

16. The device according to claim 1, wherein
the first insulating member further includes a fourth insulating region, and
at least a part of the fourth insulating region is between the third electrode and the first conductive member.

17. The device according to claim 1, wherein at least a part of the first insulating region is between the fourth partial region and fifth partial region in the first direction.

18. The device according to claim 1, wherein at least a part of the third electrode is between the first semiconductor portion and the second semiconductor portion in the first direction.

19. The device according to claim 1, wherein a distance between the first electrode and the third electrode along the first direction is shorter than a distance between the third electrode and the second electrode along the first direction.

20. The device according to claim 1, wherein
a first length of the first nitride region along the first direction is not less than 0.035 times and not more than 0.5 times a second length, and
the second length is a distance in the first direction between an end of the second semiconductor portion on a side of the third electrode and a position of a portion of the second semiconductor portion that overlaps the second electrode in the second direction.

* * * * *